United States Patent [19]

Hong et al.

[11] Patent Number: 5,449,638
[45] Date of Patent: Sep. 12, 1995

[54] PROCESS ON THICKNESS CONTROL FOR SILICON-ON-INSULATOR TECHNOLOGY

[75] Inventors: Gary Hong; Chen-Chiu Hsue; H. J. Wu, all of Hsin-Chu, Taiwan; Lawrence Y. Lin, Cupertino, Calif.

[73] Assignee: United Microelectronics Corporation, Hsinchu, Taiwan

[21] Appl. No.: 254,532

[22] Filed: Jun. 6, 1994

[51] Int. Cl.⁶ ............................................. H01L 21/76
[52] U.S. Cl. ........................................ 437/61; 437/62; 437/974; 148/DIG. 12; 148/DIG. 135
[58] Field of Search ............... 437/61, 62, 974; 148/DIG. 12, DIG. 135

[56] References Cited

U.S. PATENT DOCUMENTS

| | | | |
|---|---|---|---|
| 4,501,060 | 2/1985 | Frye et al. | 437/170 |
| 4,508,757 | 4/1985 | Fabricius et al. | 156/662 |
| 4,784,970 | 11/1988 | Solomon | 437/62 |
| 4,851,366 | 7/1989 | Blanchard | 437/61 |
| 4,971,925 | 11/1990 | Alexander et al. | 437/62 |
| 5,091,330 | 2/1992 | Cambou et al. | 437/62 |
| 5,162,254 | 11/1992 | Usui et al. | 437/63 |
| 5,183,783 | 2/1993 | Ohta et al. | 437/225 |
| 5,238,865 | 8/1993 | Eguchi | 148/DIG. 135 |
| 5,268,326 | 12/1993 | Lesk et al. | 148/DIG. 12 |

FOREIGN PATENT DOCUMENTS

| | | | |
|---|---|---|---|
| 0226166 | 9/1989 | Japan | 437/974 |
| 0305534 | 12/1989 | Japan | 437/62 |
| 0005545 | 1/1990 | Japan | 437/62 |
| 0023629 | 1/1990 | Japan | 437/62 |
| 0045953 | 2/1990 | Japan | 437/62 |
| 0267949 | 11/1990 | Japan | 437/62 |
| 0095912 | 4/1991 | Japan | 437/62 |
| 0136346 | 6/1991 | Japan | 437/61 |
| 0232239 | 10/1991 | Japan | 437/62 |
| 0166722 | 7/1993 | Japan | 437/62 |

OTHER PUBLICATIONS

Becker et al., "Low Pressure Deposition of Doped $SiO_2$ by Pyrolysis of Tetraethylorthosilicate (TEOS)"; J. Electrochem Soc.: Solid State Science and Technology, vol. 134, No. 11, 1987, pp. 2923–2931.

"Bonding & Etch-Back Silicon-On-Insulator" pp. 684–687, IEDM 1985.

Primary Examiner—Brian E. Hearn
Assistant Examiner—Trung Dang
Attorney, Agent, or Firm—George O. Saile; Stephen B. Ackerman

[57] ABSTRACT

A method for forming a thin, uniform top silicon layer using bonded-wafer SOI technology is described. A dielectric layer is formed on a first surface of a first silicon substrate. A trench is formed in a first surface of a second silicon substrate. A polishing stopper is formed in the trench. A second dielectric layer with a smooth top surface is formed over the polishing stopper and over the first surface of the second silicon substrate. The smooth top surface of the second dielectric layer of the second silicon substrate is bonded to the dielectric layer of the first silicon substrate. Material is removed from the exposed surface of the second silicon substrate to form the silicon layer with well-controlled thickness, having a top surface co-planar with the polishing stopper.

36 Claims, 5 Drawing Sheets

PROCESS ON THICKNESS CONTROL FOR SILICON-ON-INSULATOR TECHNOLOGY

BACKGROUND OF THE INVENTION

(1) Field of the Invention

The invention relates to a method for forming silicon-on-insulator substrates, and more particularly to a method for accurately controlling the thickness and uniformity of the top silicon layer for silicon-on-insulator technology applications.

(2) Description of the Related Art

Dielectric isolation of semiconductor devices has proven to be effective for improving several important device parameters. In particular, Silicon-on-Insulator (SOI) technology offers good isolation, reduced short channel effects, radiation hardness, high voltage breakdown, and high-speed circuitry. Typically, semiconductor islands are isolated from each other with a vertical dielectric, and have a bottom surface that is adjacent to a horizontal dielectric layer as well. Semiconductor devices are then formed in the semiconductor islands.

Several methods have been described for providing dielectric isolation. In one method, known as SIMOX (Separation by IMplanted OXygen), oxygen atoms are implanted at a very high energy into a single-crystal silicon substrate, followed by an annealing step, thereby forming a horizontal layer of silicon oxide at a depth below the surface of the substrate. However, there typically is damage to the substrate in the form of severe dislocations as a result of the implant. One of the most promising SOI approaches is bonded-wafer technology, as described, for instance, by J. B. Lasky et al in "Bonding and Etch-Back, Silicon-On-Insulator", pp. 684–687, IEDM 1985. Two substrates of single-crystal silicon, each with one oxidized surface, are bonded together at the oxidized surfaces. Lapping is then performed on one of the silicon substrates to reduce its thickness.

However, the desired thicknesses need to be on the order of 1 micron or less, in order to reduce parasitic capacitance and increase circuit speed. Lapping to this small a thickness is difficult due to variations in the smoothness and uniformity of the semiconductor surface being worked. One solution is shown in U.S. Pat. No. 5,091,330 (Cambou et al), in which a dielectric is formed in trenches in one of the two bonded substrates, prior to bonding, and is used as an etch stop for chemical/mechanical polishing to provide a thin semiconductor layer for the formation of devices.

SUMMARY OF THE INVENTION

It is therefore an object of this invention to provide a method for forming a thin, uniform top silicon layer using bonded-wafer SOI technology.

This object is achieved by the following. A dielectric layer is formed on a first surface of a first silicon substrate. A trench is formed in a first surface of a second silicon substrate. A polishing stopper is formed in the trench. A second dielectric layer with a smooth top surface is formed over the polishing stopper and over the first surface of the second silicon substrate. The smooth top surface of the second dielectric layer of the second silicon substrate is bonded to the dielectric layer of the first silicon substrate. Material is removed from the exposed surface of the second silicon substrate to form the silicon layer with well-controlled thickness, having a top surface co-planar with the polishing stopper.

DESCRIPTION OF THE PREFERRED EMBODIMENTS

Referring now to FIGS. 1 to 4, a first method for forming a thin, uniform silicon layer with bonded-wafer SOI technology is described. A first single-crystal substrate (not shown) is formed having one surface of an oxide. The oxide has a thickness of between about 500 and 10,000 Angstroms, and may be formed by thermal oxidation, or chemical vapor deposition (CVD).

A second single-crystal silicon substrate 10 is provided. A thin oxide layer 12 is formed on the surface of substrate 10 by thermal oxidation, to a thickness of between about 100 and 1000 Angstroms. A layer of silicon nitride 14 is deposited on the oxide layer 12 by, for example, chemical vapor deposition (CVD), to a thickness of between about 500 and 5000 Angstroms. Photoresist 16 is deposited over the nitride and is patterned by conventional lithography and etching. The structure of FIG. 1 is completed by etching through the oxide and nitride by plasma etching.

Figure 2:
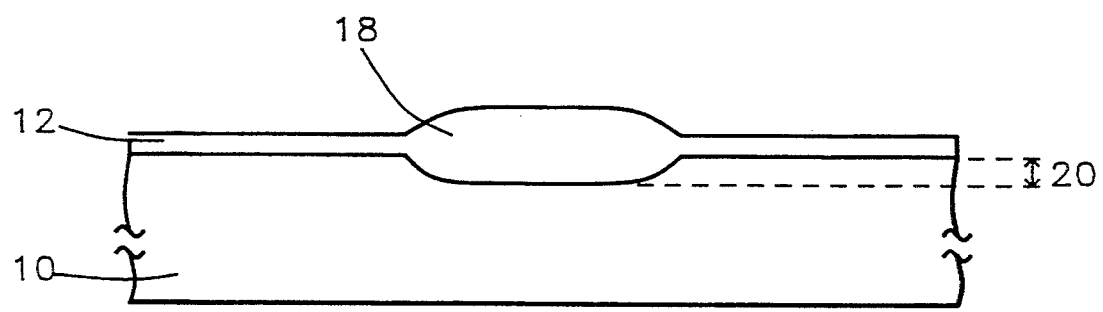

Referring now to FIG. 2, polishing stopper 18 is formed by thermal oxidation. The substrate is exposed to wet oxidation in O2 and H2 (oxygen and hydrogen) at a temperature of between about 800° and 1000° C., for between about 20 and 200 minutes. The polishing stopper 18 is formed to a total thickness of between about 3000 and 20,000 Angstroms, with the critical dimension 20 of between about 1000 and 10,000 Angstroms. This dimension will ultimately determine the thickness of the final top silicon layer of the invention. Nitride layer 14 is then removed by etching with phosphoric acid (H3PO4).

Figure 3:
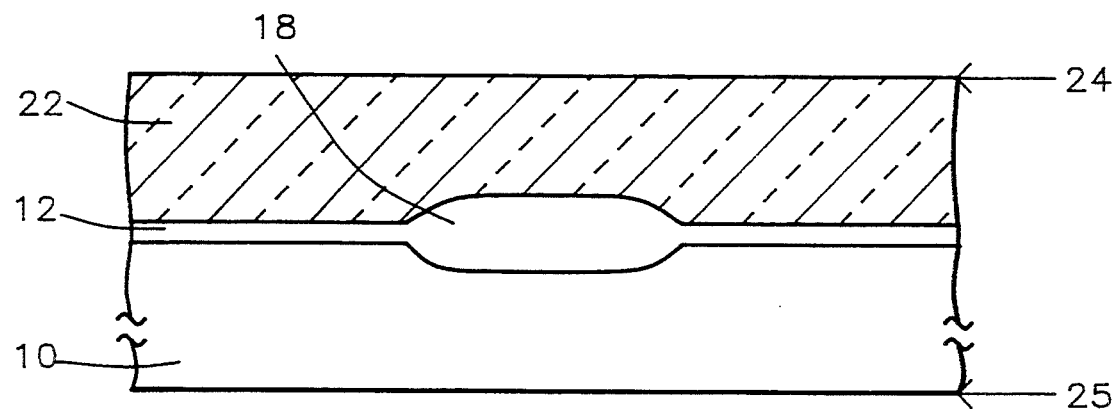

As shown in FIG. 3, a CVD oxide 22 is now deposited. This may be BPSG (borophosphosilicate glass), PSG (phosphosilicate glass), or BPTEOS (borophospho tetraethylorthosilicate), and is formed to a thickness of between about 3000 and 20,000 Angstroms. It is important that the top surface 24 be smooth, since this surface will be used as a bonding surface to the first substrate. For each of the oxide 22 materials noted above, the top surface may be planarized (i.e., made smooth) by reflow, by heating to a temperature of between about 800° and 1000° C., for between about 10 and 30 minutes.

Figure 1:
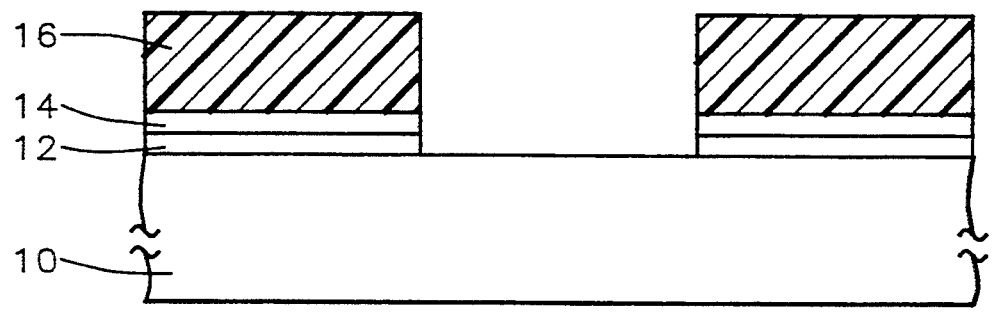
FIGS. 1 to 4 are cross-sectional representations of a first method for fabricating the thin, uniform silicon layer of the invention using SOI technology.
Figure 4:
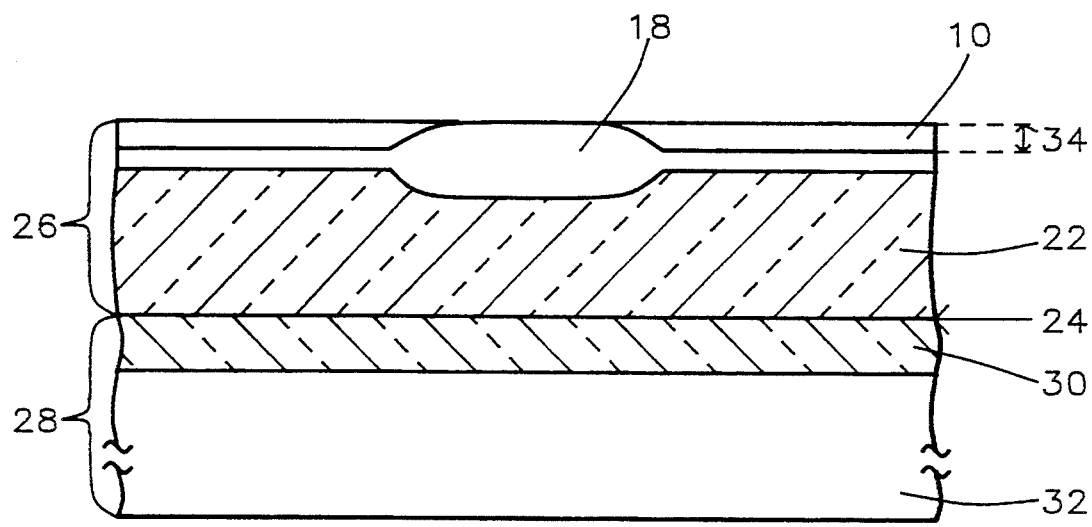

Referring now to FIG. 4, the second substrate 26 of FIGS. 1 to 3 is bonded to the first substrate 28 by electrostatic bonding, in which a moderate voltage of about 20 volts is applied between the two wafers, in an N2 (nitrogen) ambient, at a temperature of between about 1000° and 1300° C. Oxide layer 30, on monocrystalline silicon 32 of first substrate 28, is bonded to dielectric layer 22 of second substrate 26. Following bonding, surface 25 (as shown in FIG. 3), is subjected to wafer grinding (mechanical removal of material) to remove some of the single-crystal silicon, down to a thickness of between about 10 and 30 micrometers.

To reduce silicon layer 10 to its final thickness, the wafer is subjected to chemical/mechanical polishing, in which the wafer is held and rotated against a polishing surface, on which there is a polishing slurry containing abrasive material such as alumina or silica. At the same time, a chemical etchant may be introduced so that material is removed from the wafer by both chemical and mechanical means. Polishing stopper 18 inhibits further polishing once the polishing surface comes in contact with it. This results in a final thickness 34 for silicon layer 10 of between about 1000 and 10,000 Angstroms. This thin, uniform layer provides excellent device characteristics for semiconductor devices that are subsequently formed in layer 10, particularly reduced parasitic capacitance which results in higher circuit speeds.

A second method for forming a thin, uniform, high quality silicon layer in an SOI technology is discussed with reference to FIGS. 5 to 7. A first monocrystalline silicon substrate 37 is formed with an oxide layer 38. A second single-crystal silicon substrate 40 is provided. A trench 42 is formed in the surface of substrate 40 by plasma etch of silicon. This trench has a depth 45 of between about 1000 and 10,000 Angstroms. A thin layer 44 of silicon nitride is formed on the surface of substrate 40 and in the trench 42 by chemical vapor deposition, to a thickness of between about 1000 and 2000 Angstroms.

Figure 6:
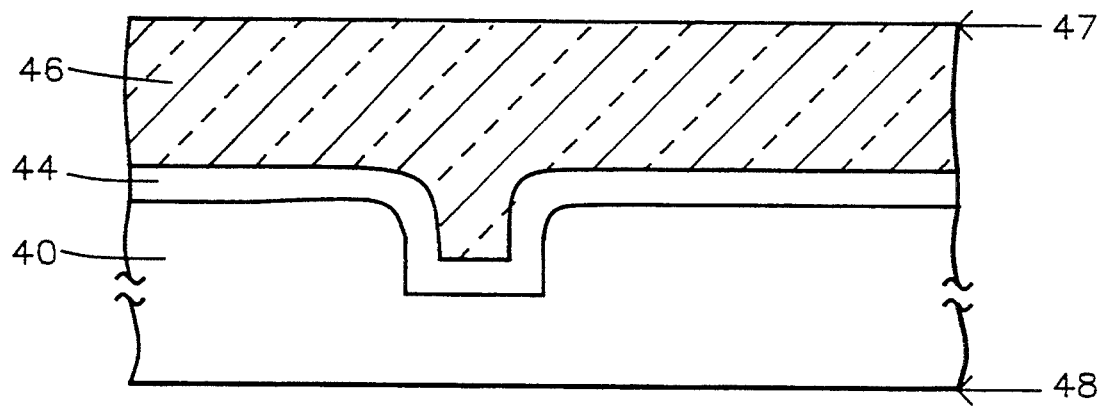

As shown in FIG. 6, a CVD oxide 46 is now deposited. As in the first method of the invention, this may be BPSG (borophosphosilicate glass), PSG (phosphosilicate glass), or BPTEOS (borophospho tetraethylorthosilicate), and is formed to a thickness of between about 3000 and 20,000 Angstroms. Top surface 47 is planarized by reflow, by heating to a temperature of between about 800° and 1000° C., for between about 10 and 30 minutes.

Figure 5:
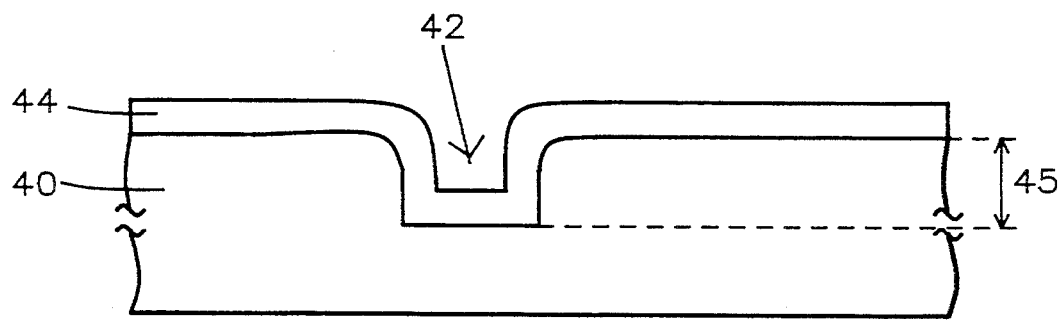
FIGS. 5 to 7 are cross-sectional representations of a second method of the invention.
Figure 7:
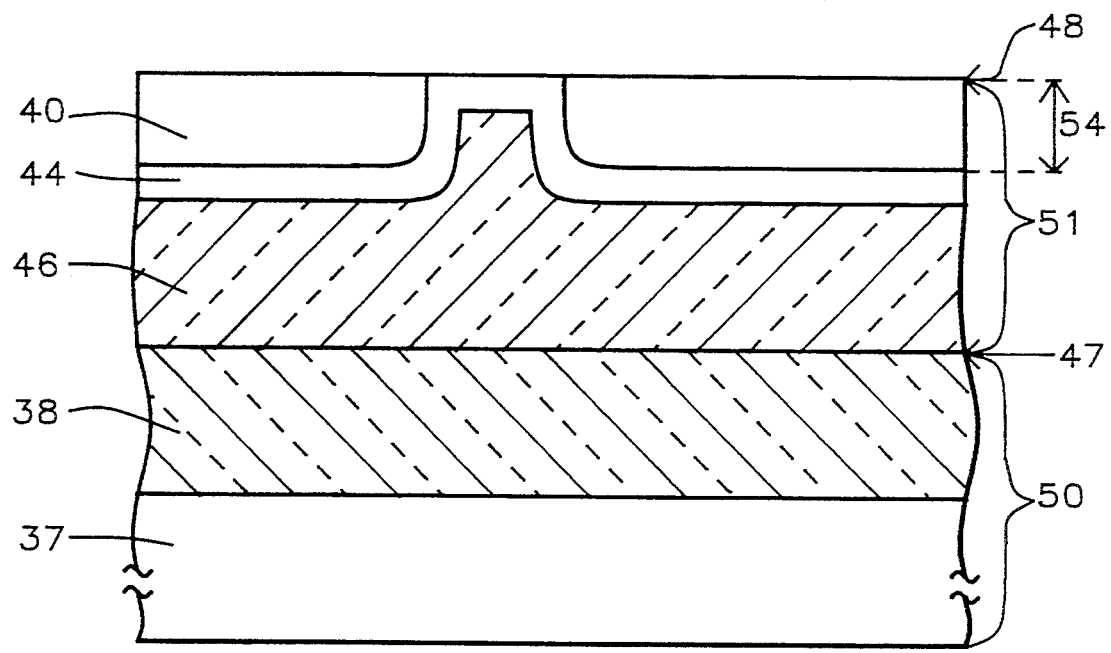

Referring now to FIG. 7, the second substrate 51 of FIGS. 5 and 6 is bonded to the first substrate 50 by electrostatic bonding, as in the first method of the invention. Oxide layer 38, on monocrystalline silicon 37 of substrate 50, is bonded to dielectric layer 46 of substrate 51. Following bonding, surface 48 (as shown in FIG. 6), is subject to wafer grinding to remove some of the single-crystal silicon, down to a thickness of between about 10 and 30 micrometers.

To reduce silicon layer 40 to its final thickness, the wafer is subjected to chemical/mechanical polishing, to reduce this layer to a final thickness 54 of between about 1000 and 10,000 Angstroms, wherein nitride layer 44 acts as a CMP polishing stopper.

Figure 8:
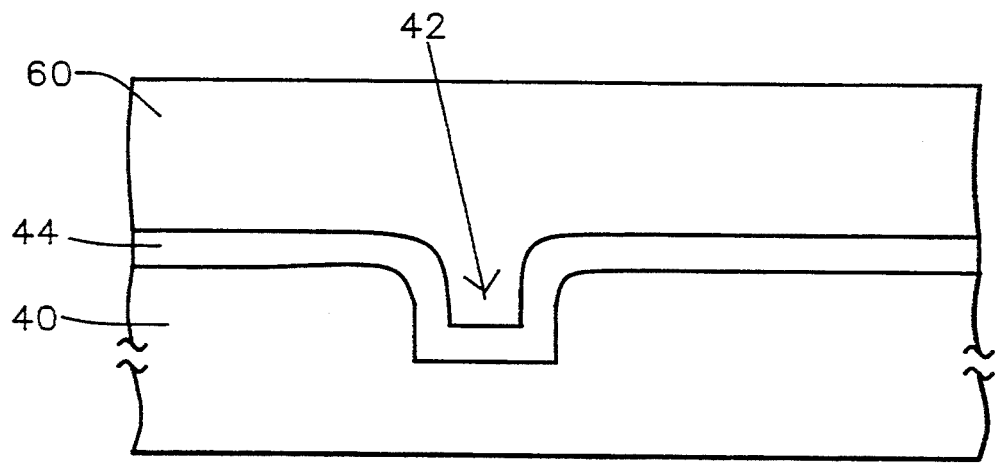
FIGS. 8 to 10 are cross-sectional representations of a third method of the invention.
Figure 9:
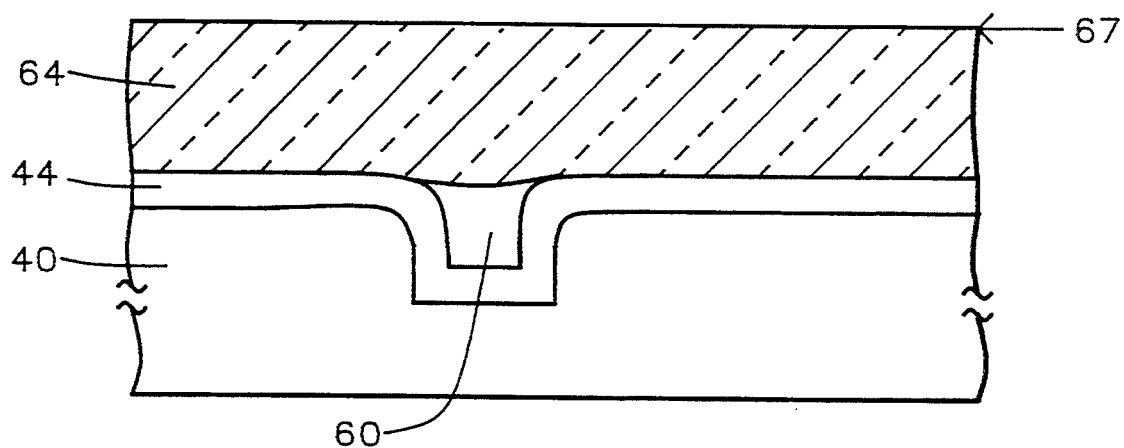
Figure 10:
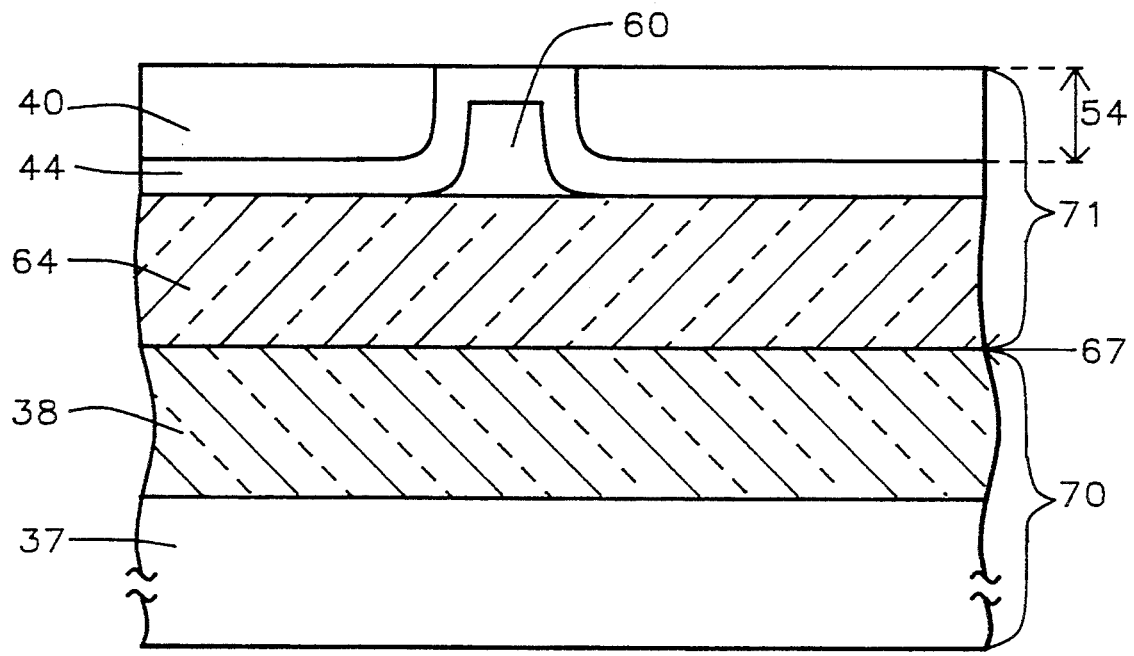

A third method of the invention is described with respect to FIGS. 8 to 10. Starting from the FIG. 5 structure, a layer 60 of polycrystalline silicon, or polysilicon, is deposited over nitride layer 44 by LPCVD (Low Pressure Chemical Vapor Deposition), to a thickness of between about 2000 and 20,000 Angstroms, as shown in FIG. 8. This poly layer is then polished down by CMP with nitride layer 44 acting as a polishing stop, such that there is polysilicon remaining only in opening 62.

Referring now to FIG. 9, a CVD oxide 64 is deposited. By filling opening 62 with polysilicon, especially if this opening is wide, CVD oxide 64 as initially deposited has a smoother top surface (than when the opening is filled with the CVD oxide) and can be more easily planarized. As in the other methods of the invention, layer 64 may be borophosphosilicate glass (BPSG), PSG (phosphosilicate glass), or BPTEOS (borophospho tetraethylorthosilicate), and is formed to a thickness of between about 3000 and 20,000 Angstroms. Top surface 67 is planarized by reflow, by heating to a temperature of between about 800° and 1000° C., for between about 10 and 30 minutes.

Referring now to FIG. 10, substrate 71 is bonded to the first substrate 70 by electrostatic bonding. Processing continues as in the second method to result in the final FIG. 10 structure. It can be seen that nitride layer 44 thus acts as a CMP polishing stopper for both polysilicon 60 and silicon 40 polishing steps.

The polishing stoppers, which selectively resist the silicon CMP, need to be formed at suitable locations of the silicon (Si) wafer such that the polishing can proceed uniformly over the entire Si surface. When the polishing process is done in an IC (Integrated Circuit) facility, the stoppers may be provided in correspondence to the dicing lines of the semiconductor wafer. The dicing lines are the preferred location for the stoppers because they will not consume chip area.

Figure 11:
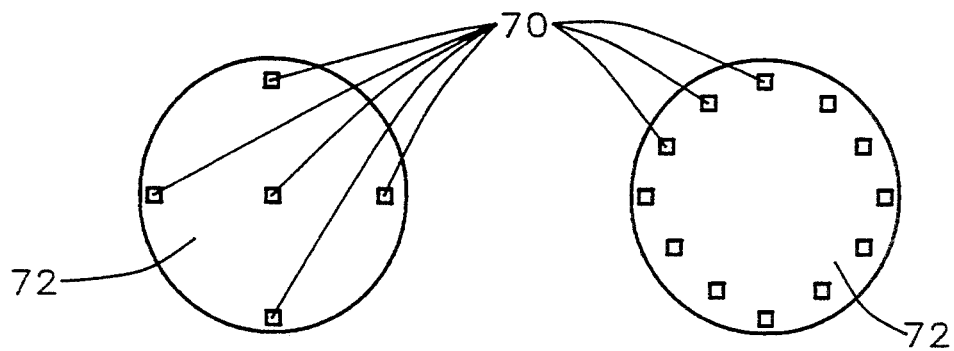
FIGS. 11 and 12 show a top view of silicon wafers indicating the location of the polishing stoppers of the invention.
Figure 12:
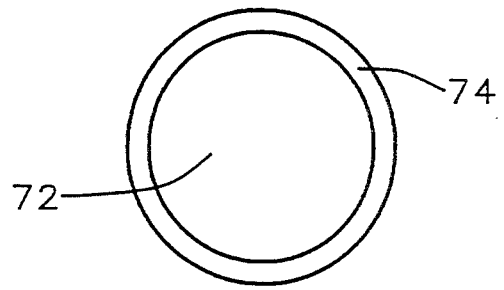

If the polishing process needs to be completed by the wafer supplier, several fixed stoppers may be generated evenly across the wafer, as, for instance, shown in FIG. 11, in which alternate stopper locations 70 are shown on wafer 72. Another fixed stopper arrangement is shown in FIG. 12, in which a stopper ring 74 is formed around the outer periphery of the wafer.

While the invention has been particularly shown and described with reference to the preferred embodiments thereof, it will be understood by those skilled in the art that various changes in form and details may be made without departing from the spirit and scope of the invention.

We claim:

1. A method of forming a silicon layer with well-controlled thickness using silicon-on-insulator technology, comprising the steps of:

forming a first dielectric layer on a first surface of a first silicon substrate;

forming a trench in a first surface of a second silicon substrate;

forming a polishing stopper in said trench;

forming a second dielectric layer with a smooth top surface over said polishing stopper and over said first surface of said second silicon substrate, wherein said second dielectric layer is formed of a reflowable oxide deposited by CVD (chemical vapor deposition), and wherein said smooth top surface of said second dielectric layer is formed by heating said reflowable oxide;

bonding said smooth top surface of said second dielectric layer of said second silicon substrate to said first dielectric layer of said first silicon substrate; and removing material, by first wafer grinding and then chemical/mechanical polishing of said material, from exposed surface of said second silicon substrate to form said silicon layer with well-controlled thickness, having a top surface co-planar with said polishing stopper.

2. The method of claim 1 wherein said silicon layer with well-controlled thickness has a thickness of between about 1000 and 10,000 Angstroms.

3. The method of claim 1 wherein forming said trench and said polishing stopper is accomplished simultaneously, comprising the steps of:

forming an oxide layer over said first surface of said second silicon substrate;

forming a nitride layer over said oxide layer;

patterning said oxide and nitride layers to form an opening;

forming said trench and said polishing stopper by oxidation of said first surface of said second silicon substrate, within said opening; and removing said nitride layer.

4. The method of claim 3 wherein said oxide layer has a thickness of between about 100 and 1000 Angstroms.

5. The method of claim 3 wherein said nitride layer has a thickness of between about 500 and 5000 Angstroms.

6. The method of claim 3 wherein said polishing stopper by oxidation is formed by heating at a temperature of between about 800° and 1000° C., for between about 20 and 200 minutes, in an ambient of oxygen and hydrogen.

7. The method of claim 6 wherein said polishing stopper is formed to a thickness of between about 3000 and 20,000 Angstroms.

8. The method of claim 1 wherein said second dielectric layer is formed of borophosphosilicate glass, to a thickness of between about 3000 and 20,000 Angstroms.

9. The method of claim 1 wherein said smooth top surface of said second dielectric layer is formed by heating to a temperature of between about 800° and 1000° C. for between about 10 and 30 minutes.

10. The method of claim 1 wherein said wafer grinding reduces thickness of said second silicon substrate to between about 10,000 and 30,000 Angstroms.

11. The method of claim 1 wherein said polishing stopper acts as an end point for said chemical/mechanical polishing.

12. The method of claim 1 wherein said bonding is by electrostatic bonding, in which a voltage of about 20 volts is applied between said first and second silicon substrates, while holding said first and second silicon substrates in contact with each other, in a nitrogen ambient, at a temperature of between about 1000° and 1300° C.

13. The method of claim 1 wherein said trench is formed by a plasma etch of said second silicon substrate to a depth of between about 1000 and 10,000 Angstroms.

14. The method of claim 13 wherein said polishing stopper is created by forming a layer of silicon nitride in said trench and over said first surface of said second silicon substrate.

15. The method of claim 14 wherein said layer of silicon nitride is formed to a thickness of between about 1000 and 2000 Angstroms.

16. The method of claim 14 wherein said second dielectric layer is formed of borophosphosilicate glass, to a thickness of between about 3000 and 20,000 Angstroms.

17. The method of claim 14 wherein said second dielectric layer is formed of borophospho tetraethylorthosilicate, to a thickness of between about 3000 and 20,000 Angstroms.

18. The method of claim 17 wherein said smooth top surface of said second dielectric layer is formed by heating to a temperature of between about 800° and 1000° C. for between about 10 and 30 minutes.

19. The method of claim 13 wherein said forming a polishing stopper comprises the steps of:

forming a layer of silicon nitride in said trench and over said first surface of said second silicon substrate;

forming a layer of polycrystalline silicon over said silicon nitride; and polishing said layer of polycrystalline silicon such that the only remaining polycrystalline silicon is in said trench.

20. The method of claim 19 wherein said layer of silicon nitride is formed to a thickness of between about 1000 and 2000 Angstroms.

21. The method of claim 19 wherein said layer of polycrystalline silicon is formed to a thickness of between about 2000 and 20,000 Angstroms.

22. The method of claim 19 wherein said second dielectric layer is formed of borophosphosilicate glass, to a thickness of between about 3000 and 20,000 Angstroms.

23. A method of forming a semiconductor device in a top silicon layer of a silicon-on-insulator substrate, comprising the steps of:

forming a first dielectric layer on a first surface of a first silicon substrate;

forming an oxide layer over a first surface of a second silicon substrate;

forming a nitride layer over said oxide layer;

patterning said oxide and nitride layers to form an opening;

forming a polishing stopper by oxidation of said first surface of said second silicon substrate, in said opening;

removing said nitride layer;

forming a second dielectric layer with a smooth top surface over said polishing stopper and over said first surface of said second silicon substrate, wherein said second dielectric layer is formed of a reflowable oxide deposited by CVD (chemical vapor deposition), and wherein said smooth top surface of said second dielectric layer is formed by heating said reflowable oxide;

bonding said smooth top surface of said second dielectric layer of said second silicon substrate to said dielectric layer of said first silicon substrate, to form the silicon-on-insulator substrate;

removing material, by first wafer grinding and then chemical/mechanical polishing of said material, from exposed surface of said second silicon substrate to form the silicon layer with a top surface co-planar with said polishing stopper; and forming said semiconductor device in said silicon layer.

24. The method of claim 23 wherein said silicon layer has a thickness of between about 1000 and 10,000 Angstroms.

25. The method of claim 23 wherein said polishing stopper by oxidation is formed by heating at a temperature of between about 800° and 1000° C., for between about 20 and 200 minutes, in an ambient of oxygen and hydrogen.

26. The method of claim 23 wherein said polishing stopper is formed to a thickness of between about 3000 and 20,000 Angstroms.

27. The method of claim 23 wherein said second dielectric layer is formed of borophosphosilicate glass, to a thickness of between about 3000 and 20,000 Angstroms.

28. The method of claim 23 wherein said wafer grinding reduces thickness of said second silicon substrate to between about 10,000 and 30,000 Angstroms.

29. The method of claim 23 wherein said polishing stopper acts as an end point for said chemical/mechanical polishing.

30. A method of forming a silicon layer with well-controlled thickness using silicon-on-insulator technology, comprising the steps of:

forming a first dielectric layer on a first surface of a first silicon substrate;

forming a trench in a first surface of a second silicon substrate;

forming a polishing stopper in said trench, by forming a layer of silicon nitride in said trench and over said first surface of said second silicon substrate;

forming a second dielectric layer with a smooth top surface, over said layer of silicon nitride, wherein said second dielectric layer is formed of a reflowable oxide deposited by CVD (chemical vapor deposition), and wherein said smooth top surface of said second dielectric layer is formed by heating said reflowable oxide;

bonding said smooth top surface of said second dielectric layer of said second silicon substrate to said first dielectric layer of said first silicon substrate; and removing material, by first wafer grinding and then chemical/mechanical polishing of said material, from exposed surface of said second silicon substrate to form said silicon layer with well-controlled thickness, having a top surface co-planar with said polishing stopper.

31. The method of claim 30 wherein said silicon layer with well-controlled thickness has a thickness of between about 1000 and 10,000 Angstroms.

32. The method of claim 30 wherein said trench is formed by a plasma etch of said second silicon substrate to a depth of between about 1000 and 10,000 Angstroms.

33. The method of claim 30 wherein said layer of silicon nitride is formed to a thickness of between about 1000 and 2000 Angstroms.

34. The method of claim 30 wherein said wafer grinding reduces thickness of said second silicon substrate to between about 10,000 and 30,000 Angstroms.

35. The method of claim 30 wherein said polishing stopper acts as an end point for said chemical/mechanical polishing.

36. The method of claim 30 wherein said bonding is by electrostatic bonding, in which a voltage of about 20 volts is applied between said first and second silicon substrates, while holding said first and second silicon substrates in contact with each other, in a nitrogen ambient, at a temperature of between about 1000° and 1300° C.

* * * * *